(12) United States Patent
Laing

(10) Patent No.: US 6,956,784 B1
(45) Date of Patent: Oct. 18, 2005

(54) WRITABLE MEMORY

(75) Inventor: David Gerrard Laing, Newbury (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/910,231

(22) Filed: Aug. 3, 2004

(51) Int. Cl.[7] ............................................. G11C 07/00
(52) U.S. Cl. .................... 365/225.7; 365/154
(58) Field of Search ............................ 365/225.7, 154, 365/200, 201

(56) References Cited

U.S. PATENT DOCUMENTS 5,487,037 A * 1/1996 Lee ....................... 365/189.11
6,285,619 B1 * 9/2001 Daniel et al. ............ 365/225.7
6,363,020 B1 * 3/2002 Shubat et al. ............... 365/200

\* cited by examiner

Primary Examiner—Vu A. Le
(74) Attorney, Agent, or Firm—Wolf, Greenfield & Sacks P.C.

(57) ABSTRACT

A memory is provided in which each memory cell can be in a first state or a second state, and those cells which should be in the first state always correctly power up into that state whereas cells which should be in the second state may power up incorrectly. A counting arrangement is provided to count the number of cells in either of the states and to compare this with a predetermined number. If the numbers do not match, a memory reset is performed. The memory cells can be constructed from a single fusible element thereby saving space whilst also consuming substantially zero power following power up.

14 Claims, 7 Drawing Sheets

2 BIT HALF ADDER

WRITABLE MEMORY

FIELD OF THE INVENTION

The present invention relates to a writable memory. In particular, the invention relates to a memory having low power consumption and reduced footprint on the semiconductor die.

BACKGROUND OF THE INVENTION

It is often desirable to be able to program control words into a semiconductor device after its manufacture. These control words may control the functionality of the device and/or may be coefficients for adjusting operating parameters of the device in order to meet some desired specification.

A well known way of providing a reliable non-volatile memory which can be written to only once is a cross coupled pair of transistors as shown in FIG. 1. It can be seen that the arrangement includes a first fuse 2 arranged in series with a first transistor 4, and a second fuse 6 arranged in series with a second transistor 8. The transistors 4 and 8 are field effect transistors and the gate of the transistor 4 is connected to a node between the fuse 6 and the transistor 8 and the gate of the transistor 8 is connected to a node between the fuse 2 and the transistor 4. Source terminals of the transistors are connected to the ground supply rail and the fuses 2 and 6 are connected to the positive supply rail $V_{DD}$. In order to program this arrangement the fuses 2 and 6 have to be selectively blown with one of the fuses being left intact. Thus, if the output of this memory cell is represented by the node 10, then in order to write a "1" into the memory the fuse 6 must be left intact whereas the fuse 2 must be blown, thereby making it high impedance. This means that the gate of the transistor 4 will be held high by virtue of the low impedance connection through the fuse 6 to the positive supply rail $V_{DD}$ whereas the gate of the transistor 8 will be held low due to the low impedance path to ground through the transistor 4. This makes a stable configuration which will always return to its correct state, even after power up, whilst also consuming essentially no current since ideally no current flows through the fuse 2 and transistor 4 since the fuse 2 is blown, and no current flows through the fuse 6 and transistor 8 because the transistor 8 is held hard off by virtue of its gate being connected to ground through the transistor 4. Therefore this memory circuit is very reliable. In practice a blown fuse often exhibits a high impedance but is not "non-conducting". Hence a small current may be drawn through the "blown" fuse and then through the series transistor which is switched on.

Unfortunately this memory circuit can occupy a relatively large amount of space on a silicon die. The fuses 2 and 6 are typically fabricated as a silicon or poly-silicon bridge between two metal contacts. As the currents required to blow the fuse are relatively large (compared to the currents that normally flow within the integrated circuit) then the power connections to the fuse are correspondingly larger. A further problem is that the transistors in series with the fuses need to be able to pass sufficient current to blow the fuse in the first place. This generally results in two transistors being fabricated for each fuse. Thus in FIG. 1 transistor 4 is an active transistor to the memory cell whereas transistor 4a is provided solely to pass the fuse blowing current. Similar transistors 8 and 8a are provided on the other limbs of the memory cell. As a result these fuse blowing transistors 4a, 8a are very large compared to the size of a transistors 4 and 8 which are fabricated merely for a logic gate and are provided solely for conducting the fuse blowing current during device programming. Therefore, in summary, although the arrangement shown in FIG. 1 makes a reliable memory cell, it is relatively bulky on the silicon die and this is disadvantageous as there is often competition for space on the silicon die between different parts of the circuit fabricated thereon.

This problem has been recognised in the prior art and more compact memory cells, such as that shown in FIG. 2 have been described. The arrangement shown in FIG. 2 only comprises one fusible element 12 in series combination with a transistor 14. An output of the memory cell is represented by the node 16. In general, the transistor 14 is held off until it is desired to read the memory. When a memory read is performed, a test voltage is applied to the gate of the transistor 14 so as to turn the transistor 14 on. If the fuse is intact, then the fuse will pass sufficient current to hold the output node 16 at a "1" even though current is passing through the transistor 14. However if the fuse 12 has been blown then the transistor 14 causes the node 16 to be pulled to ground. Once again during a memory write operation it is required to pass sufficient current through the fuse 12 in order to blow it. This is typically performed by fabricating a larger fuse blowing transistor 18. In any event it can be seen that this memory arrangement occupies approximately half the area of the memory cell shown in FIG. 1. However it passes relatively large currents during a memory read process if the fuse is intact whereas the memory shown in FIG. 1 does not pass large currents although as noted hereinbefore some current flow does occur. Thus space on the die has been traded for power consumption. Additionally the switching on and off of the transistor 14 can give rise to current fluctuations which can perturb the performance of other circuits.

Power consumption is, of course, often critically important. Therefore the prior art also teaches that the arrangement shown in FIG. 2 can be modified, as shown in FIG. 3, to include a RAM cell 20 which can be used to capture and hold the content of the memory cell in response to a short test pulse applied to the gate of the transistor 14. This means that current only needs to be passed by the memory cell during a relatively brief read cycle and the result can then be latched into the RAM cell 20 which is typically fabricated as a static RAM such that once it has latched the result it doesn't pass any further current (theoretically). The fabrication of the RAM cell 20 typically only requires a few relatively small transistors and hence the arrangement shown in FIG. 3 still occupies much less circuit area than the arrangement shown in FIG. 1.

Even with the modification shown in FIG. 3, the memory is still imperfect since noise on the power rails during the memory cell read cycle may result in it passing the wrong value during a read cycle. It is dangerous for any semiconductor manufacturer to assume that the users of the product can conspire to place it in a low noise environment with a stable supply. Therefore, it is common practise for the arrangement shown in FIG. 3 to be periodically polled in order to refresh the contents of the memory cell 20. This improves the integrity of the circuit but does increase its power requirements.

There is also a risk that a memory read may occur before the memory is polled to refresh its contents.

SUMMARY OF THE INVENTION

According to a first aspect of the present invention there is provided a writable memory comprising at least one memory cell, said at least one memory cell comprising a fusible element in series with the transistor, and where a state signal is derived from a node between the fusible element and the transistor, the memory further including an integrity checker arranged to make a measurement of the number of memory cells where the state signal is in a predetermined state and to compare the measurement with a predetermined check number and to cause a memory reset operation to be performed if the result of the comparison is unsatisfactory.

It is thus possible to provide a memory which uses memory cells having the relatively small footprint of the design shown in FIG. 2 but where the current consumption of the memory is comparable to the arrangement shown in FIG. 1, and where the integrity of the result from the memory can also be assured.

Because it remains important that the power consumption of the memory should be as low as possible, and ideally theoretically zero, the integrity checker is preferably implemented in static logic. This means that the current is only drawn by the integrity checker when a signal therein is making a transition. Preferably the integrity checker is unclocked and is not multiplexed, thereby reducing the number of transitions to the bare minimum and minimising the current drawn by the integrity checker.

Depending on the degree of reliability required or risk of a false bit that is acceptable, it is possible to derive a parameter such as a parity check or a hash code representative of the content of the memory and to use this as the measurement of the number of memory cells where the state signal is in a predetermined state. Therefore, given that the parity check generating circuit or hash generating circuit is appropriately constructed, the chances of getting a false confirmation that the memory content is correct can be reduced to acceptable values. However, in many circuit configurations the statistical likelihood that the memory contents are correct is not sufficient and it is desired to be absolutely positive that the contents are correct. This can, if the memory is appropriately constructed, be done by counting the number of cells in the predetermined state.

Advantageously the memory cell is constructed such that the state signal is used to form a control signal for controlling the transistor of the memory cell. A particularly advantageous configuration is to use an inverter to invert the state signal in order to form the control signal. This gives rise to an arrangement in which, if the fuse is intact, the memory cell always gives a correct output, namely a "1" from the node between the fusible element and the transistor. If the fusible element is not intact, then the memory cell should give a "zero" at its output but there remains a small risk that during power up some of the cells will output a false "1". Nevertheless the property of the memory cell that it will never give a false zero can be used and hence it becomes possible to check the integrity of the memory by counting the number of cells which are in the "1", or alternatively the "zero" state. The count of the memory cells in one or other of the states can then be compressed by a hashing process, or a similar process, and be compared with a similarly derived check number or alternatively and preferably the count of the number of cells in the predetermined state can be directly compared with the check number which itself encodes the number of cells in that predetermined state.

It would be possible to produce a full adder to add each of the memory cell contents to one another in order to determine how many of the memory cells are in a predetermined state, either "zero" or "one". However the inventor has realised that further space savings on the silicon die can be achieved by subdividing the memory into groups of memory cells and forming the sum for the group using a chain of incrementors rather than full adders. An incrementor takes a previous binary word and can either leave it unchanged or merely increment it (add 1). Thus an incrementor can be built with fewer components than a full adder and hence takes less space on the die. The outputs of the various incrementors can then be summed using full adders in order to derive a final word representative of the number of memory cells in the predetermined state. This word can then be compared with the predetermined check number, for example by a series of exclusive OR gates, in order to determine whether the numbers match.

In the event that the number of cells in a predetermined state does not equal the expected number, then it becomes necessary to perform a memory reset. This can be achieved by temporarily switching the transistors in series with the fusible element on thereby releasing any memory cells which are stuck in the wrong state. In order to achieve this a subsidiary transistor may be formed for each memory cell, with the subsidiary transistors being connected in parallel with the main transistor of the memory cell but each of the subsidiary transistors being responsive to a single control signal to switch them on, thereby performing a memory reset. Advantageously the predetermined check number is stored in a memory whose performance is completely reliable. Preferably the memory for the check number is formed using a static memory, for example the prior art type shown in FIG. 1 which is always guaranteed to enter the correct state upon power up or in the presence of noise.

In an alternative embodiment of a memory cell the fuse and transistor are arranged in series, for example as shown in FIG. 3, and the output of the fuse node 16 is latched into a RAM cell 20. It is known that if the fuse is intact then the output of the fuse node will always be "1", whereas if the fuse is blown then although the fuse node should be at zero volts, leakage through the fuse or trapped change at the fuse node may cause it to output a "1" instead of "0". However, if a fuse outputs a "0" then it can be assumed to be correct since it is very unlikely that a memory cell having an intact fuse would be able to output a "0". Thus the circuit may be arranged to count the number of RAM cells in a predetermined state and to cause a memory reset operation to be performed, such as turning on one or more of the transistors 14, if the result of the comparison with the expected number of RAM cells in the predetermined state is unsatisfactory.

Advantageously the circuit is further arranged to periodically switch on, for a brief time period, those transistors in a memory cell where the associated RAM cell outputs a "0" indicating that the fuse of the RAM cell is "blown". During this process the content of the RAM cell 20 is refreshed.

This gives some assurance that noise has not affected the content of these RAM cells. If a cell changes state then the count of the number of memory cells in the predetermined state changes and a full memory reset is initiated. Since only the memory cells with a "blown" fuse are tested then the current drawn during the memory test process is very low.

The present invention will further be described, by way of example, with reference to the accompanying drawings, in which:

FIG. 1 schematically illustrates a prior art memory cell having high reliability, low power consumption, and a relatively large footprint on the silicon die;

FIG. 2 schematically illustrates a prior art memory cell having increased power consumption and a smaller footprint compared to the memory shown in FIG. 1;

Figure 5:
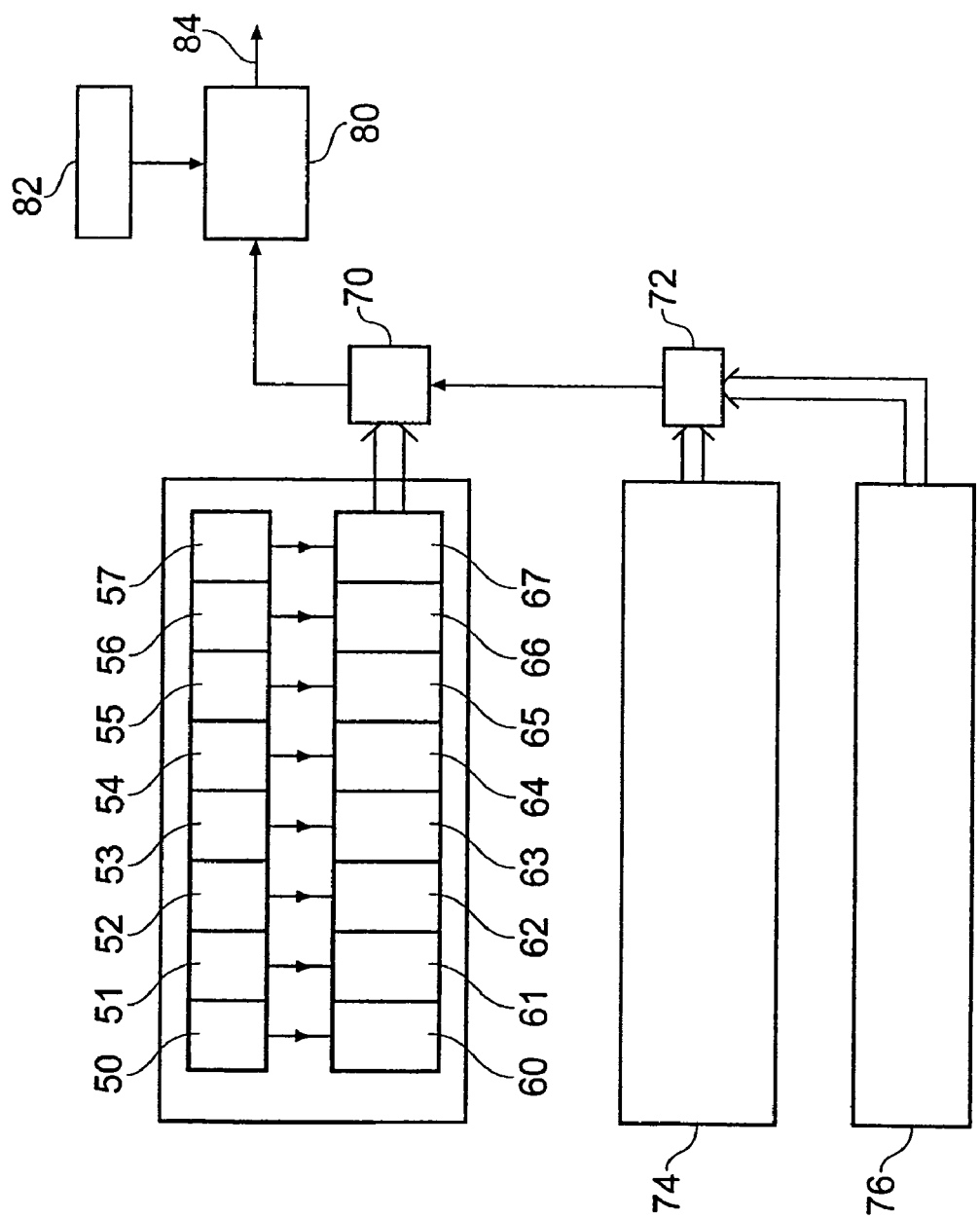
Figure 6:
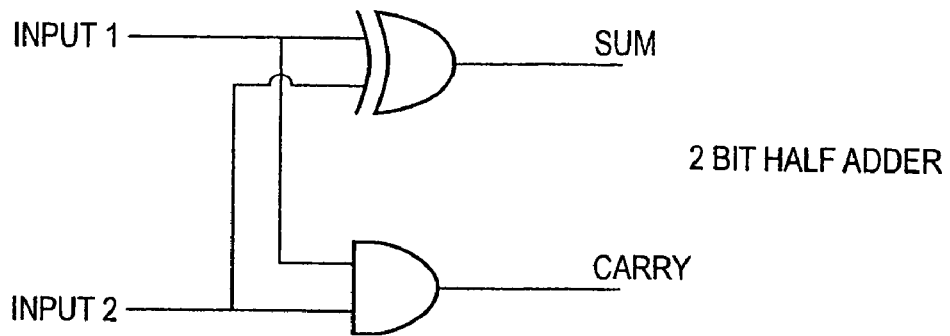
Figure 7:
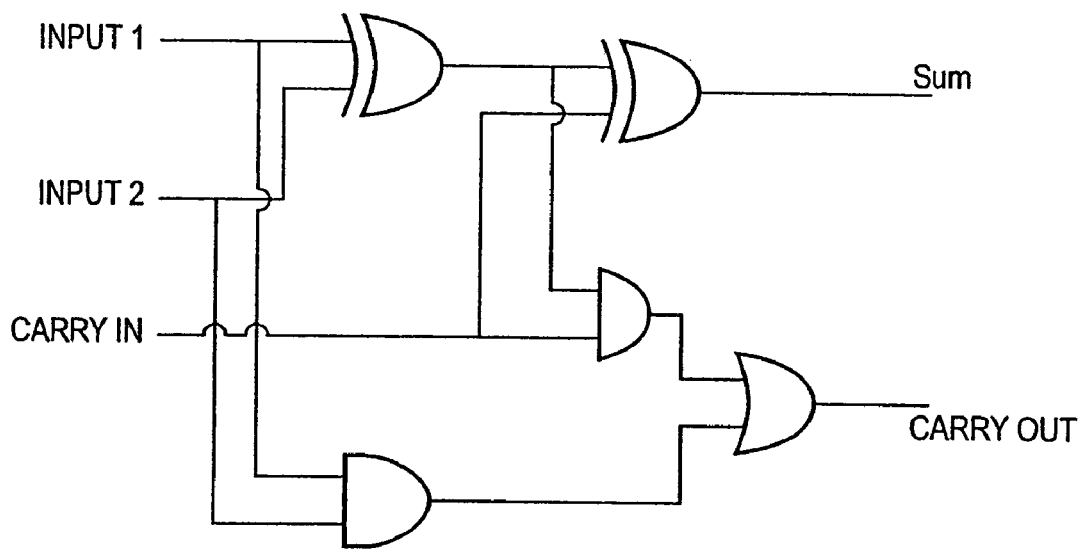
Figure 8:
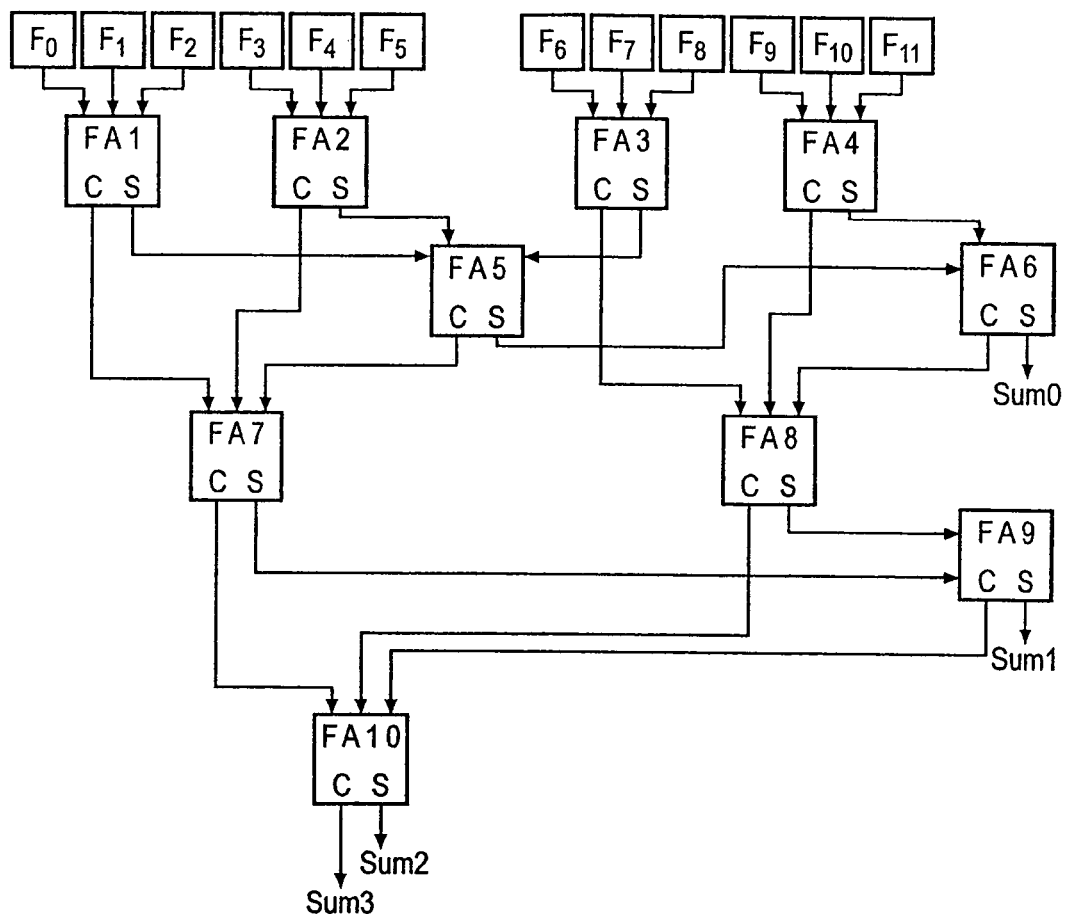
Figure 9:
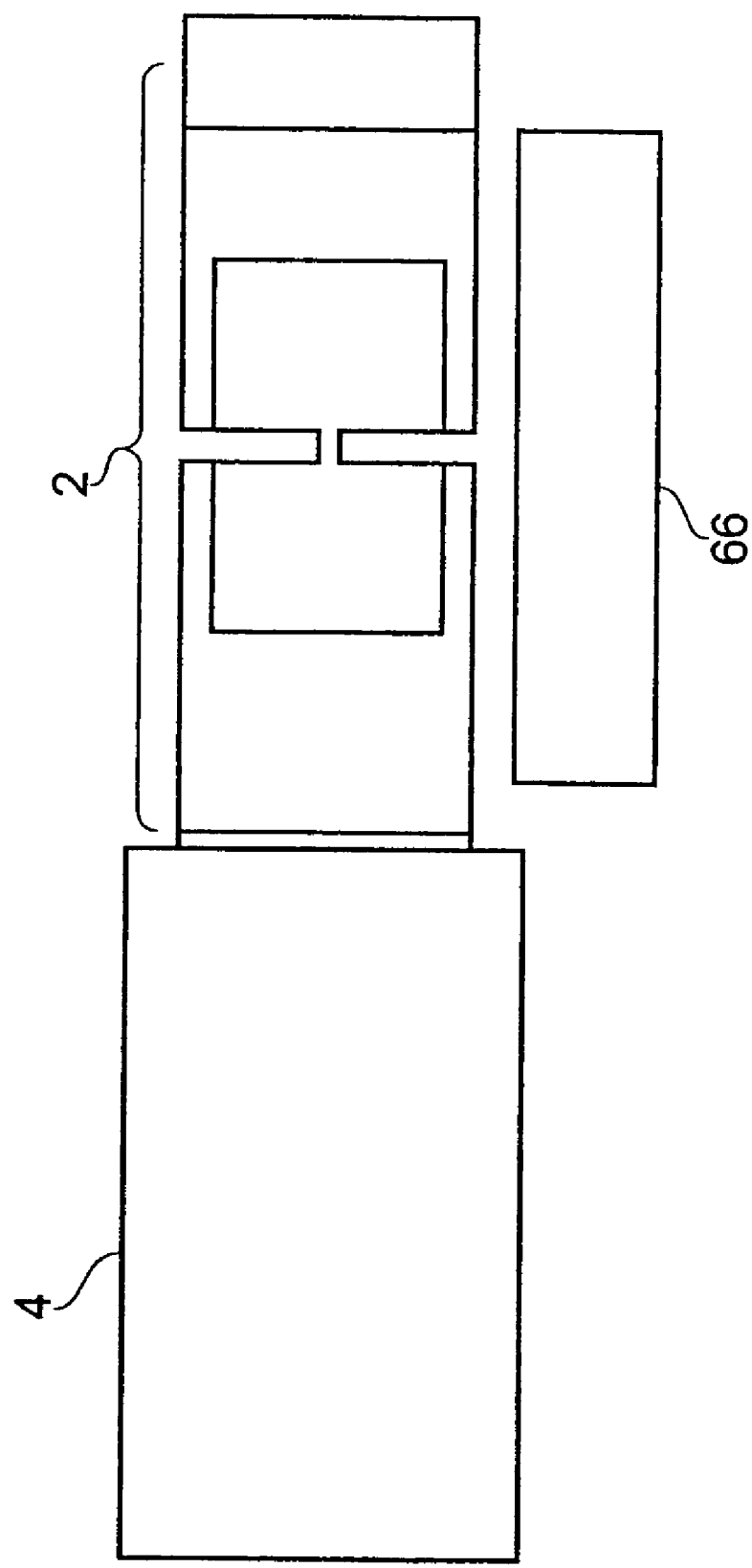
Figure 10:
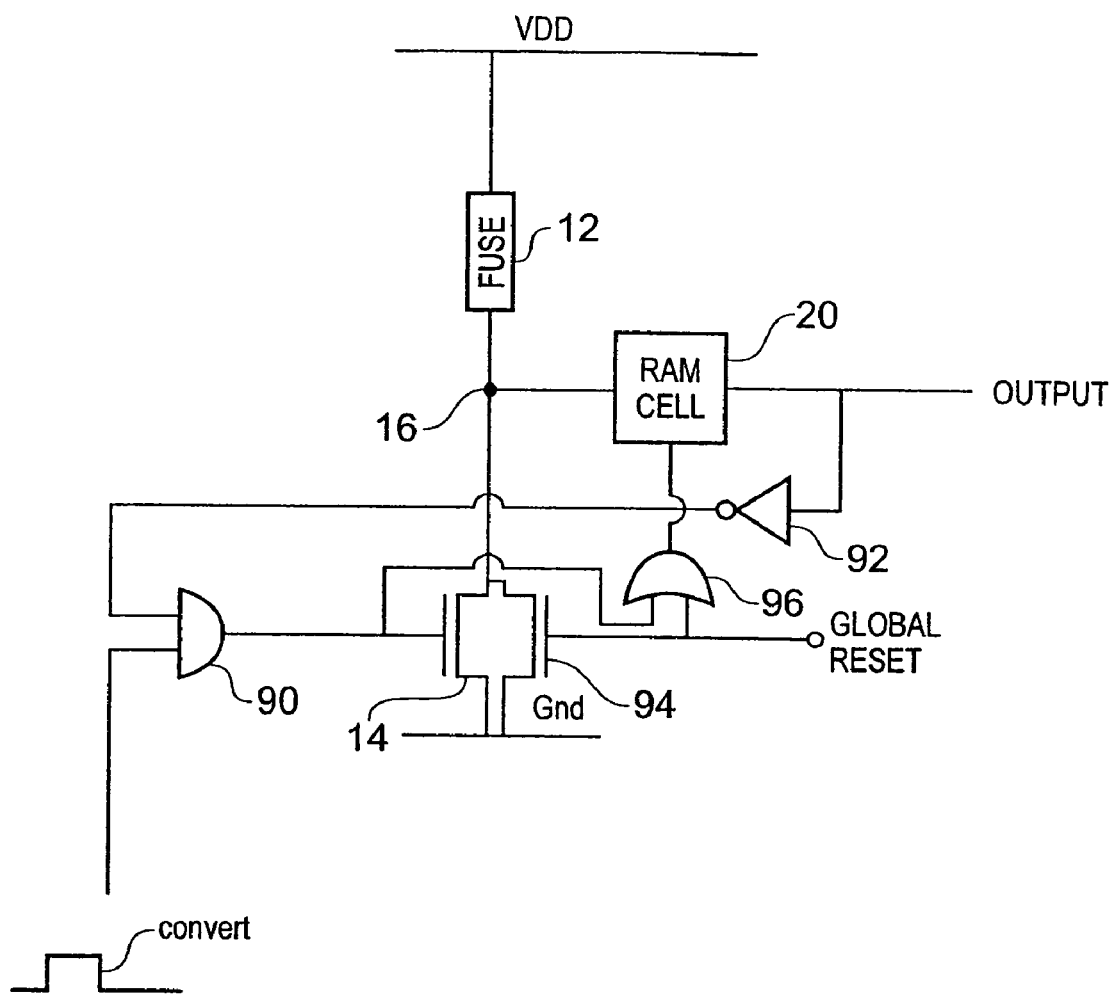

FIG. 5 schematically shows a block diagram of a memory constituting an embodiment of the present invention;

FIG. 6 shows a simple half adder;

FIG. 7 shows a simple full adder;

FIG. 8 shows a full adder tree for summing a row of memory;

FIG. 9 is a scale diagram showing the relative sizes of components within an integrated circuit; and FIG. 10 schematically illustrates a further embodiment of a memory cell within a memory constituting an embodiment of the present invention.

Figure 4:
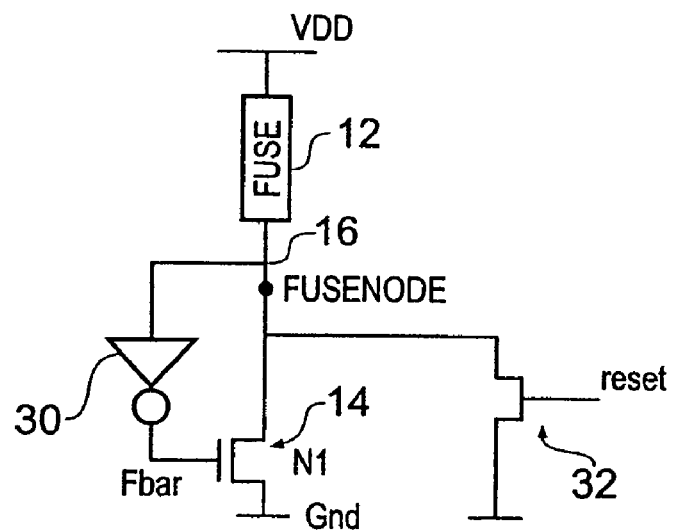
FIG. 4 shows a memory cell within a memory constituting an embodiment of the present invention.

FIG. 4 is a circuit diagram of a memory cell suitable for use in the present invention. The memory cell is similar to that shown in FIG. 2 in as much as a first terminal of the fuse 12 is connected to the power supply rail $V_{DD}$ and the second terminal of the fuse 12 is connected to the drain of a field effect transistor 14, a source of the field effect transistor is connected to the ground rail. The node 16 between the fuse 12 and the transistor 14 represents a point at which the content of the memory cell can be read. However the memory cell also includes an inverter 30 whose input is connected to the node 16 and whose output is connected to the gate of the transistor 14. It can therefore be seen that, if the fuse 12 is intact then there is a low impedance path between the supply rail $V_{DD}$ and the input of the inverter 30. Thus irrespective of whether the circuit powers up with the transistor 14 switched on or off the action of the fuse will be to drag the voltage at node 16 towards the positive supply rail thereby causing the inverter to provide a signal to the transistor 14 which switches it off. Thus, following transient current flow at power up this circuit will set into a stable state in which the node 16 is held at the supply voltage $V_{DD}$ and the transistor 14 is switched off and consumes no power.

If during a setting operation a fuse blowing transistor (either transistor 14 or a further transistor not shown) is used to blow the fuse then there is a high impedance path between the fuse node 16 and the supply rail $V_{DD}$. During power up transient conditions within the circuit and the inverter may mean that the transistor 14 either gets briefly switched on or is held permanently off. If the transistor 14 gets briefly switched on then it causes a node 16 to be briefly connected to ground, thereby causing the output of the inverter 30 to rise thereby ensuring that the transistor remains switched on and hence entering a stable state. However if the transistor remains inadvertently held off then trapped charge on parasitic capacitance at the node 16 may be sufficient to cause the input of the inverter 16 to see a false logic 1 and hence the transistor 14 is held off.

Thus the action of the memory cell is such that if the cell is supposed to encode a logic 1 (fuse not blown) then the cell always encodes this state. However if the fuse has been blown then there is a chance that the cell will incorrectly encode a fuse not blown state.

From consideration of FIG. 4 it is clear that if the memory cell incorrectly encodes a state, the cell can easily be reset by opening a low impedance path from the node 16 to ground. This could be achieved by modification of the drive to the transistor 14 such that a reset signal can be ORed with the output of the inverter 30. However a simple and reliable reset can be achieved by fabricating a reset transistor 32 in parallel with the transistor 14. The reset transistor 32 is responsive to a reset signal applied at its gate in order to cause the transistor to briefly go conducting thereby allowing any trapped charge on the node 16 to be discharged and the input of the inverter 30 to be briefly connected to ground. This places the memory cell in a stable state. The reset transistor can be fabricated as a physically small transistor.

FIG. 5 schematically illustrates a memory comprising a plurality of memory cells which have been arranged into subgroups. Typically, during fabrication of the memory, the memory is arranged into rows and columns and this normal layout can be taken advantage of and each row can constitute one of the subgroups of memory cells.

As shown in FIG. 5, a row of memory cells of the type shown in FIG. 4 is fabricated. The memory cells are designated 50 to 57. Each memory cell provides an output to an associated incrementor labelled 60 to 67. Each incrementor only receives a single bit input from its memory cell. The connection between the memory cell and the incrementor can be made by placing a further connection to the fuse node, but more preferably is made by taking a connection to the output of the inverter 30. At this point, it can be seen that the designer has a choice as to whether a blown fuse encodes a logic 1 (equivalent to taking the output from the node 16) or whether it encodes a logic zero, equivalent to taking the output from the inverter 30. It is also worthwhile noting that although FIG. 5 only shows the memory cells being placed in rows of eight cells it actually makes sense for the number of cells in each row to be as close as possible to a power of 2 minus 1. Thus ideally there would 15 cells in each row since 15 can still be encoded by a four bit binary word, being a same number of bits as is required to encode a value of eight.

In the example shown in FIG. 5 each incrementor is a four bit incrementor. Incrementors are, as noted before, simplified versions of full adders and circuit configurations for incrementors and full adders are available in text books and/or would be known to a person skilled in the art. This keeps the layout of the circuit consistent although it follows that the incrementors near the least significant end of the chain of memory cells do not have to deal with as many memory cells and hence could be built to handle less bits, for example the incrementor 60 only has to handle one bit, the incrementors 61 and 62 only have to be able to handle two bits and the incrementors 63 to 66 only have to be able to handle a three bit word. The output of the most significant incrementor 67 is provided to a full adder 70. The full adder is arranged to add the output of the incrementor 67 to a binary word which it has received from the output of a preceding full adder 72. The preceding adder 72 is associated with a further row of memory and its associated incrementors identical to those described hereinbefore and for simplicity simply labelled as 74 in the drawing. The full adder 72 can be one of a chain of adders, although it follows that if, as in this example, the adder 72 is the least significant adder then it can receive input directly from the incrementor in the block 74 and the incrementor associated with a further memory block, designated 76 for simplicity.

Thus, it follows that the output of the final adder in the chain is representative of the number of "1"'s which have been passed from the individual memory cells 50, 51, 52 and so on to their associated incrementors and hence on to the adders. This number of "1"s can be compared in a comparator 80 with an expected number of "1"'s held in a check number memory 82. Since the circuit manufacturer or programmer has knowledge of what values they have blown into the write once memory, the manufacturer or programmer therefore has sufficient information to write the number of "1"'s into the memory 82 such that the result of the comparison can be reliable. The comparator 80 compares these measurements of memory performance and asserts a reset signal on an output 84 if these comparisons do not agree. In the event of a reset occurring the reset transistor 32 is switched on. It should be noted that the configuration of the memory cell shown in FIG. 4 is such that even with the reset transistor switched on it produces an output which is representative of the state which it is supposed to encode. Therefore any memory cells which were incorrectly configured should now correct themselves and the result of this change will propagate through the incrementors and then through the adders and finally into the comparator 80. Once all the cells have reached their correct state and the result of these changes propagated through the incrementors, adders and comparator then the comparator output should change in order to remove the reset signal thereby switching the reset transistors 32 off.

As noted before, in order to save power, because this is one of the prime motivating factors behind this circuit design, the incrementors, adders and comparator 80 are implemented in static logic or pass transistor logic such that a current is only drawn (theoretically) by the logic block when making transitions between logical states. Static implementations of incrementors (which can be formed from half adders) and full adders are well known to the persons skilled in the art. However, for the sake of completeness, a simple implementation of a half adder is shown in FIG. 6 and the circuit diagram of a full adder is shown in FIG. 7. These circuits can be scaled by the person skilled in the art in order to obtain half adders and full adders of an appropriate number of bits.

Although the circuit now requires the fabrication of incrementors, adders, a comparator and a further memory 82, the circuit can still result in a substantial reduction in the footprint of the memory as a whole.

Figure 1:
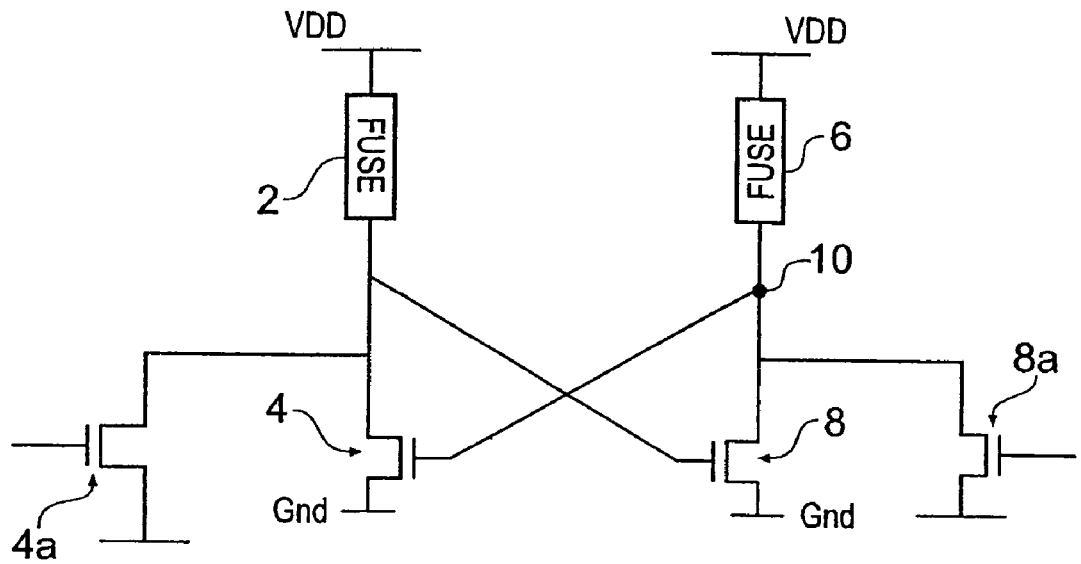

Thus the overhead per memory cell is:
1. The memory 82 comprising cross-coupled zero power transistor and fuse configurations as shown in FIG. 1=2 log$_2$ (number of memory bits).
2. A comparator=log$_2$ (number of memory bits).
3. 1 full adder circuit per row of memory, plus associated connections.
4. 1 incrementor per fuse.

If we look at the requirements of a 256 bit memory organised as 16 words each of 16 bits we see that:
The prior art in FIG. 1 requires (256×2) 512 fuses and 512 fuse blowing transistors.
The present invention requires:
256 fuse blowing transistors in the main memory
256 fuses in the main memory
A further 16 fuse blowing transistors and 16 fuses in the further memory 82
1 8bit comparator
16 8bit adders
256 5bit incrementors (5 bits are required to encode 0 to 16)
Thus per cell, the overhead is 1 5 bit incrementor, 1/16 of an 8bit adder, 1/16 of an additional fuse and fuse-blowing transistor, and 1/256 of an 8bit comparator.

Figure 2:
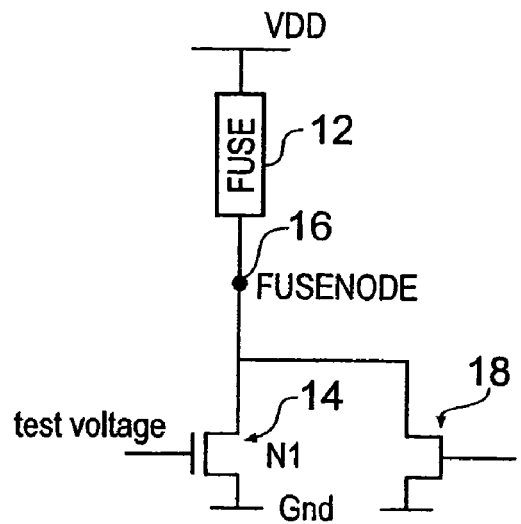

The prior art circuit of FIG. 2 is smaller than this but has a much higher power requirement due to the current flow through transistor 14 when the transistor is conducting in response to the test signal. The circuit of FIG. 3 certainly consumes more power than the present invention due to the fact both blow and unblown fuses get tested, and hence there is a low impedance path from one supply rail to the other via the unblown fuse and the transistor and it has a larger footprint than the circuit shown in FIG. 2.

The inventor has realised that other summing circuits can be used to sum the states of the memory cells. FIG. 8 shows a row of memory cells, designated $F_0$ to $F_{11}$. The contents of the cells are progressively summed using a tree of 10 full adders, designated FA1 to FA10. Thus adder FA1 sums the fuse states of cells $F_0$ to $F_2$. Full adder FA2 sums the states of cells $F_3$ to $F_5$, full adder FA3 sums cells $F_6$ to $F_8$, and full adder FA4 sums cells $F_9$ to $F_{11}$. Each full adder has a sum output S and a carrying output C. The full adders are interconnected in accordance with FIG. 8. The tree of full adders results in the generation of a 4 bit word with the least significant bit being provided by the sum output of full adder FA6, the next least significant bit being provided by the sum output of full adder FA9 and the most significant bits being provided by the sum and carrying outputs of full adders FA10.

This tree of full adders results in a more compact structure for deriving a sum.

FIG. 9 is a scale diagram showing the relative sizes of the fuse 2 and fuse-blowing transistor 4 compared to an incrementor 66. It can be seen that the incrementor is much smaller than fuse and transistor so each individual memory cell of FIG. 8 is much smaller than the equivalent cell of FIG. 1 which has two fuses and two transistors.

Again comparing the footprint of the prior art memory of FIG. 1 and the memory according to the present invention, if we consider a memory of 12 rows each of 12 bits then, taking the area of the fuse to be "unit area".

Each prior art cell consists of:

| | |
|---|---|
| 2 fuses = | 2 × 1 |
| 2 fuse-blowing transistors = | 2 × 1.06 |
| 1 latch (for programming) = | 1 × 0.52 |

This is 4.64 units per cell, making 668.16 in total.
Using the present invention, we have:

| | |
|---|---|
| 1 fuse = | 1 × 1 |
| 1 fuse-blowing transistor = | 1 × 1.06 |
| 1 Ram latch = | 1 × 0.52 |

Total is 2.58 per cell or 30.96 for each row of twelve cells.
We also have 10 full adders in the full adder tree for each row occupying a total area of 2.5 units bring the area up to 33.46 units per row. Each row is also associated with an 8 bit full adder occupying another 2 units, giving a total of 35.46 units per word. For 12 rows this occupies 425.52 units. We also need the additional memory of 8 bits×4.64 (because it was the memory of FIG. 1) making a footprint of 462.64 units, or 31% smaller.

In terms of power requirement, the memory of the present invention draws substantially no power. Comparing this with the memory of FIG. 3 (which is more power efficient than FIG. 2) each pulse to test the state of a fuse typically consumes 4–8 $\mu$W per fuse in 0.5 $\mu$m transistors refreshed at 1 MHz. If we assume the lower figure and that half of the memory contains a "1" then the power consumed is 280 $\mu$W for a 1 MHz sampling rate. If we sample faster or have a bigger memory the power requirement goes up. This contrasts to the present invention where the power requirement remains substantially zero irrespective of the size of the memory.

It should also be noted that large memories tend to give better space savings as the overhead of the further memory and the adders is shared between more elements.

Figure 3:
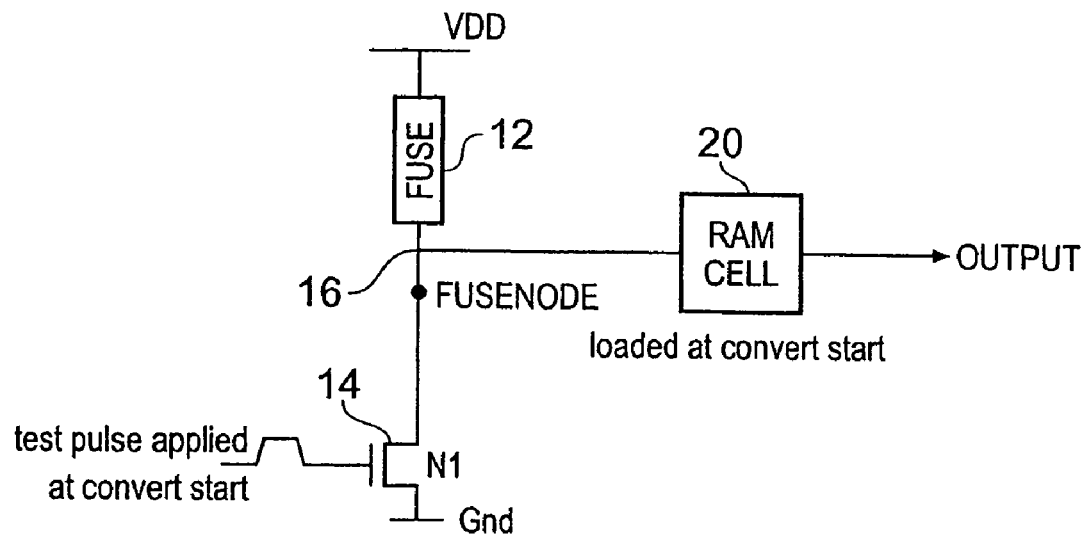
FIG. 3 shows an improvement to the memory shown in FIG. 2 thereby reducing its power consumption but slightly increasing its footprint.

FIG. 10 shows an alternative memory cell configuration based on the prior art memory cell shown in FIG. 3. Like reference numerals will be used for like parts. In this amended cell, further circuitry has been included in order to allow the cell to regularly update the RAM cell contents 20 if the RAM cell output is low, and hence it can be assumed that the fuse 12 is blown. This allows the cell to be frequently retested, assuming that the fuse is probably blown, without incurring a significant current penalty through the cell. In order to do this, the test pulse or convert signal which was applied directly to the gate of the transistor 14 in FIG. 3 is now supplied to the first input of an AND gate 90. The output of the RAM cell 20 is supplied to a second input of the AND gate 90 via an inverter 92. Thus the test signal only propagates to the gate of the transistor 14 if the output of the RAM cell is zero. The convert signal is periodically asserted and hence those memory cells in which the fuse is believed to the be blown periodically update themselves. The outputs of the memory cells are provided to summing circuits, for example as shown in FIG. 5 and hence the total number of cells in a predetermined state can be counted. For example, the number of cells having a "1" as an output may be counted. If the number of cells having a "1" as the output differs from the expected number of cells in this state, then the comparator 80 can assert a signal to cause a global reset to be performed. This could be achieved by fabricating a further transistor 94 in parallel with the transistor 14 and switching this further transistor 94 on in order to cause a reset. During the global reset, or during the individual converts for those cells where the transistor 14 is being switched on, a control signal is supplied to the RAM cell 20 of the memory cell in order to cause it to update. This can be achieved by providing both the convert signal and the global signal to the RAM cell 20 by way of an OR gate 96. Although, in FIG. 10, the inverter 92 is shown as having its input connected to the output of the RAM cell 20, it is clear that the inverter 92 could be moved such that its input could be connected to the fuse node 16. This makes the circuit more similar to that shown in FIG. 4. Thus, in essence, FIG. 4 could be regarded as being modified to include switching means that acts to always hold the transistor 14 hard off if the fuse 12 is in a low impedance state, and that allows the transistor 14 to be only switched on just some of the time if the fuse 12 is in a high impedance state.

Although the present invention has been described with reference to circuit arrangements where the fuse is connected to the positive supply rail and a pull down transistor is provided in the form of an PMOS transistor, the technique works equally well with arrangements where the fuse is connected to the negative supply/ground rail and a pull up transistor is provided.

Technologies also exist where fuses are initially in a high impedance state and can be "blown" into a conducting state. The present invention is also suitable for use with such technologies. It is also suitable for use with devices where fuses may be blown by laser or other non-electrical means.

It is thus possible to provide a substantially zero power reliable memory with a reduced footprint.

What is claimed is:

1. A writable memory comprising at least one memory cell, said at least one memory cell comprising a fusible element in series with a transistor, and where a state signal is derived from a node between the fusible element and the transistor, the memory further including an integrity checker arranged to make a measurement of the number of memory cells where the state signal is in a predetermined state and to compare the measurement with a predetermined check number, and to cause a memory reset operation to be performed if the result of the comparison is unsatisfactory.

2. A writable memory as claimed in claim 1, in which the integrity checker counts the number of memory cells that are in the predetermined state.

3. A writable memory as claimed in claim 1 in which the state signal is used to derive a drive signal for the transistor of a memory cell such that the transistor is turned off if the fusible element is conducting or in a low impedance state.

4. A writable memory as claimed in claim 3, in which the drive signal for the transistor is an inverted version of the state signal.

5. A writable memory as claimed in claim 1, in which the integrity checker is fabricated using asynchronous logic or pass transistor logic.

6. A writable memory as claimed in claim 1, in which the integrity checker is fabricated using static logic or pass transistor logic.

7. A writable memory as claimed in claim 1, in which the memory is sub-divided into a plurality of divisions, and a sum of the memory cells in the predetermined state in a division is formed by a summing arrangement associated with the division.

8. A writable memory as claimed in claim 7, in which a further summing arrangement sums the contributions from each division.

9. A writable memory as claimed in claim 1, in which the check number is held in a non-volatile check number memory.

10. A writable memory as claimed in claim 9, in which the check number memory comprises cross-coupled transistor-fuse arrangements.

11. A writable memory as claimed in claim 1, in which the memory reset operation is performed if the number of memory cells in the predetermined state differs from the check number.

12. A writable memory as claimed in claim 1, in which each memory cell has a reset transistor for selectively providing a low impedance path to the node between the fusible element and the transistor.

13. A method of checking the integrity of a memory comprising forming a measurement of the number of memory cells in a predetermined state, and comparing the measurement with a value representative of the number of memory cells that should be in the predetermined state.

14. A method as claimed in claim 13, further comprising the step of performing a memory reset if the result of the comparison in unacceptable.

* * * * *